United States Patent
Jo et al.

(10) Patent No.: US 9,735,121 B2
(45) Date of Patent: Aug. 15, 2017

(54) SEMICONDUCTOR CHIP, SEMICONDUCTOR PACKAGE INCLUDING THE SAME, AND METHOD OF FABRICATING THE SAME

(71) Applicant: Samsung Electronics Co., Ltd., Suwon-si, Gyeonggi-do (KR)

(72) Inventors: Ahyun Jo, Seoul (KR); Seungmo Kang, Hwaseong-si (KR); Yooncheol Bang, Daegu (KR); Seokwoo Hong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/222,114

(22) Filed: Jul. 28, 2016

(65) Prior Publication Data

US 2017/0062367 A1    Mar. 2, 2017

(30) Foreign Application Priority Data

Aug. 26, 2015  (KR) .......................... 10-2015-0120331

(51) Int. Cl.
  *H01L 23/58*   (2006.01)
  *H01L 29/10*   (2006.01)
  (Continued)

(52) U.S. Cl.
  CPC .............. *H01L 24/09* (2013.01); *H01L 22/14* (2013.01); *H01L 24/05* (2013.01); *H01L 24/33* (2013.01);
  (Continued)

(58) Field of Classification Search
  CPC ..... H01L 24/09; H01L 24/05; H01L 23/3128; H01L 25/0657; H01L 24/33; H01L 22/14;
  (Continued)

(56) References Cited

U.S. PATENT DOCUMENTS 6,342,399 B1   1/2002  Degani
6,780,748 B2   8/2004  Yamaguchi et al.
(Continued)

FOREIGN PATENT DOCUMENTS

KR    10-1006521 B1    1/2011

*Primary Examiner* — Stephen W Smoot
*Assistant Examiner* — Vicki B Booker
(74) *Attorney, Agent, or Firm* — Harness, Dickey & Pierce, P.L.C.

(57) ABSTRACT

A semiconductor chip and/or a semiconductor package including the same are disclosed. The semiconductor chip may include an integrated circuit on a substrate, a center pad electrically connected to the integrated circuit, a lower insulating structure on the center pad and having a contact hole exposing the center pad, the lower insulating structure including a plurality of lower insulating layers sequentially stacked on the substrate, a conductive pattern including a contact portion, a pad portion, a conductive line portion, the contact portion filling the contact hole, the pad portion including a test region and a bonding region, a conductive line portion on the lower insulating structure and connecting the contact portion to the pad portion, and an upper insulating structure on the conductive pattern and having a first opening exposing the pad portion, and the upper insulating structure including an upper insulating layer and a polymer layer.

20 Claims, 18 Drawing Sheets

(51) Int. Cl.
*H01L 23/00* (2006.01)
*H01L 21/66* (2006.01)
*H01L 23/31* (2006.01)
*H01L 25/065* (2006.01)

(52) U.S. Cl.
CPC ...... *H01L 23/3128* (2013.01); *H01L 25/0657* (2013.01); *H01L 2224/0401* (2013.01); *H01L 2224/04026* (2013.01); *H01L 2224/04042* (2013.01); *H01L 2224/48091* (2013.01)

(58) Field of Classification Search
CPC ... H01L 2224/0401; H01L 2224/48091; H01L 2224/04026; H01L 2224/04042
See application file for complete search history.

(56) References Cited

U.S. PATENT DOCUMENTS

| | | |
|---|---|---|
| 7,221,173 B2 | 5/2007 | Bachman et al. |
| 7,569,423 B2 | 8/2009 | Kwon et al. |
| 7,910,922 B2 | 3/2011 | Nishimura et al. |
| 8,309,373 B2 | 11/2012 | Abiru |
| 8,957,503 B2 | 2/2015 | Yang et al. |
| 9,006,891 B2 | 4/2015 | Liang et al. |
| 9,035,459 B2 | 5/2015 | Arvin et al. |

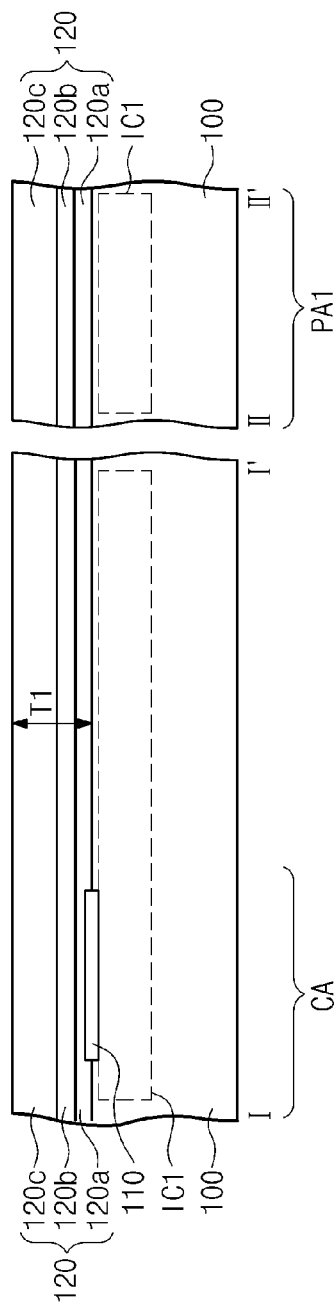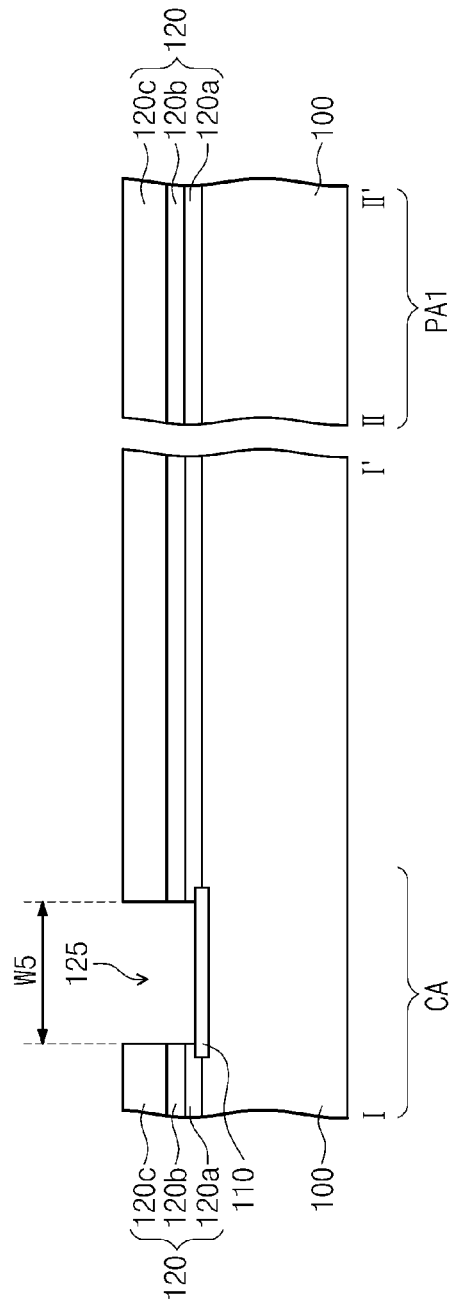

SEMICONDUCTOR CHIP, SEMICONDUCTOR PACKAGE INCLUDING THE SAME, AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2015-0120331, filed on Aug. 26, 2015, in the Korean Intellectual Property Office, the entire contents of which are hereby incorporated by reference.

BACKGROUND

This disclosure relates to semiconductor chips with a redistribution layer, semiconductor packages including the same, and/or methods of fabricating the same.

Due to their small-size, multi-functionality, and/or low-cost characteristics, semiconductor devices are widely adopted in the electronic industry. Generally, semiconductor devices are classified into a memory device for storing data, a logic device for processing data, and a hybrid device for performing various functions.

As the electronic industry advances, there is an increasing demand for a semiconductor device with a higher integration density and higher performance. One possible approach to meet such a demand is nto reduce a process margin (for example, in a photolithography process). However, the reduction of the process margin may lead to other challenges in fabricating a semiconductor device.

Alternatively, various package technologies have been developed to meet demands for larger capacity, thinner thickness, and smaller size of semiconductor devices and/or electronic appliances. For example, a package technology of vertically stacking semiconductor chips has been used to allow an electronic product to have higher density and larger capacity features. This package allows many semiconductor chips to be stacked on a reduced area, compared to a package with a single semiconductor chip.

SUMMARY

Some example embodiments of the inventive concepts provide a semiconductor chip, in which a redistribution layer with a test region and a bonding region is provided.

Some example embodiments of the inventive concepts provide a method of fabricating a semiconductor chip with a redistribution layer, using a deposition and patterning process.

Some example embodiments of the inventive concepts provide a semiconductor package, in which a semiconductor chip with a redistribution layer is provided.

According to an example embodiment, a semiconductor chip includes an integrated circuit on a substrate, a center pad on the substrate and electrically connected to the integrated circuit, a lower insulating structure on the center pad, the lower insulating structure having a contact hole exposing the center pad therethrough, the lower insulating structure including a plurality of lower insulating layers sequentially stacked on the substrate, a conductive pattern including a contact portion, a pad portion, and a conductive line portion, the contact portion filling the contact hole, the pad portion including a test region and a bonding region, the conductive line portion on the lower insulating structure and connecting the contact portion to the pad portion, and an upper insulating structure on the conductive pattern, the upper insulating structure having a first opening exposing the pad portion, the upper insulating structure including an upper insulating layer and a polymer layer, the upper insulating layer covering the lower insulating structure and the conductive pattern, the polymer layer on the upper insulating layer.

According to an example embodiment, a semiconductor package, includes a package substrate and at least one semiconductor chip on the package substrate and electrically connected to the package substrate through a wire. The at least one semiconductor chip may include a first surface facing the package substrate and a second surface opposite to the first surface, a center pad on the second surface, a lower insulating structure having a contact hole exposing the center pad, a conductive pattern comprising a contact portion, a pad portion, and a conductive line portion, the contact portion filling the contact hole, the pad portion including a test region and a bonding region, the pad portion having a first width in a first direction and a second width in a second direction crossing the first direction, the first and second directions being parallel to the second surface, the bonding region spaced apart from the test region in the first direction and connected to the wire, the first width ranging from 1.5 to 3 times the second width, the conductive line portion on the lower insulating structure and connecting the contact portion to the pad portion, and an upper insulating structure on the conductive pattern, the upper insulating layer having an opening defined therein, the opening exposing the pad portion.

According to an example embodiment, a method of fabricating a semiconductor chip includes forming a center pad on a substrate, the substrate including an integrated circuit, the center pad being electrically connected to an the integrated circuit, forming a lower insulating structure on the semiconductor chip to cover the center pad, the lower insulating structure including one or more lower insulating layers, patterning the lower insulating structure to form a contact hole exposing the center pad, forming a conductive layer to fill at least a portion of the contact hole, patterning the conductive layer to form a conductive pattern on the lower insulating structure, the conductive pattern extending in a direction and including a pad portion with a test region and a bonding region, forming an upper insulating structure on the conductive pattern and the lower insulating structure, the upper insulating structure including an upper insulating layer and a polymer layer, the upper insulating layer covering the lower insulating structure and the conductive pattern, the polymer layer on the upper insulating layer, and patterning the upper insulating structure to form an opening, the opening exposing a pad portion of the conductive pattern.

According to an example embodiment, a semiconductor package includes a package substrate, a semiconductor chip including, a chip pad electrically connected to an integrated circuit and exposed through a lower insulating structure, a conductive pattern connected to the chip pad at around a first end portion thereof and extending on the lower insulating structure, and an upper insulating structure on the conductive pattern and the lower insulating structure, the upper insulating structure including an opening divided by a separation pattern, the opening being at around a second end portion of the conductive pattern, the second end portion being opposite to the first end portion, portions of the conductive pattern exposed by the opening functioning as a pad portion, the pad portion including a bonding region and a test region defined by the separation pattern, the test region being a region onto which a test probe is to be applied, and, and a wire connecting the bonding region of the conductive pattern of the semiconductor chip to the package substrate. The lower insulating structure is between a chip substrate and the conductive pattern. The lower insulating structure has a recess region formed in an upper portion thereof. When viewed in a plan view, the recess region is not overlapped with the conductive pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6 through 11 are sectional views, each of which illustrates sections taken along lines I-I' and II-II' of FIG. 2, and illustrate a method of fabricating a first semiconductor chip according to an example embodiment of the inventive concepts.

It should be noted that these figures are intended to illustrate the general characteristics of methods, structure and/or materials utilized in certain example embodiments and to supplement the written description provided below. However, these drawings are not to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments of the inventive concepts will now be described more fully with reference to the accompanying drawings, in which example embodiments are shown. Example embodiments of the inventive concepts may, however, be embodied in many different forms and should not be construed as being limited to the example embodiments set forth herein; rather, these example embodiments are provided so that this disclosure will be thorough and complete, and will fully convey the concepts of example embodiments to those of ordinary skill in the art.

Figure 1:
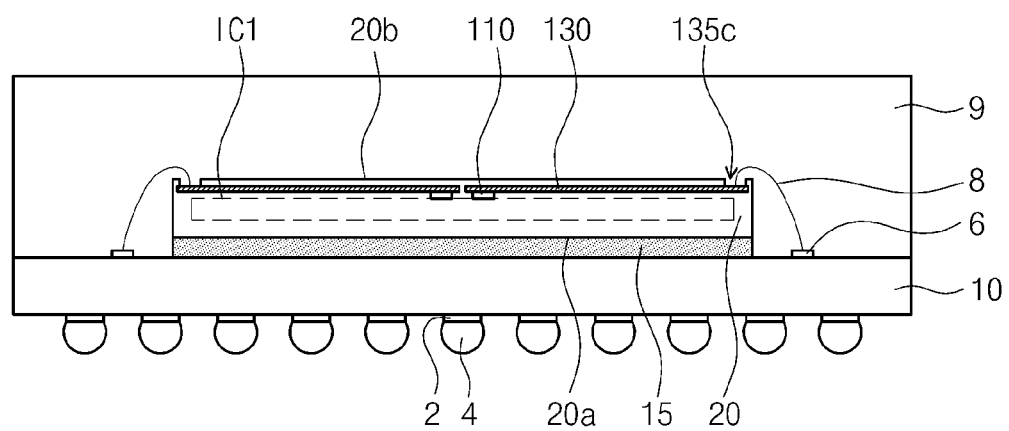
FIG. 1 is a sectional view illustrating a semiconductor package according to an example embodiment of the inventive concepts.
Figure 2:
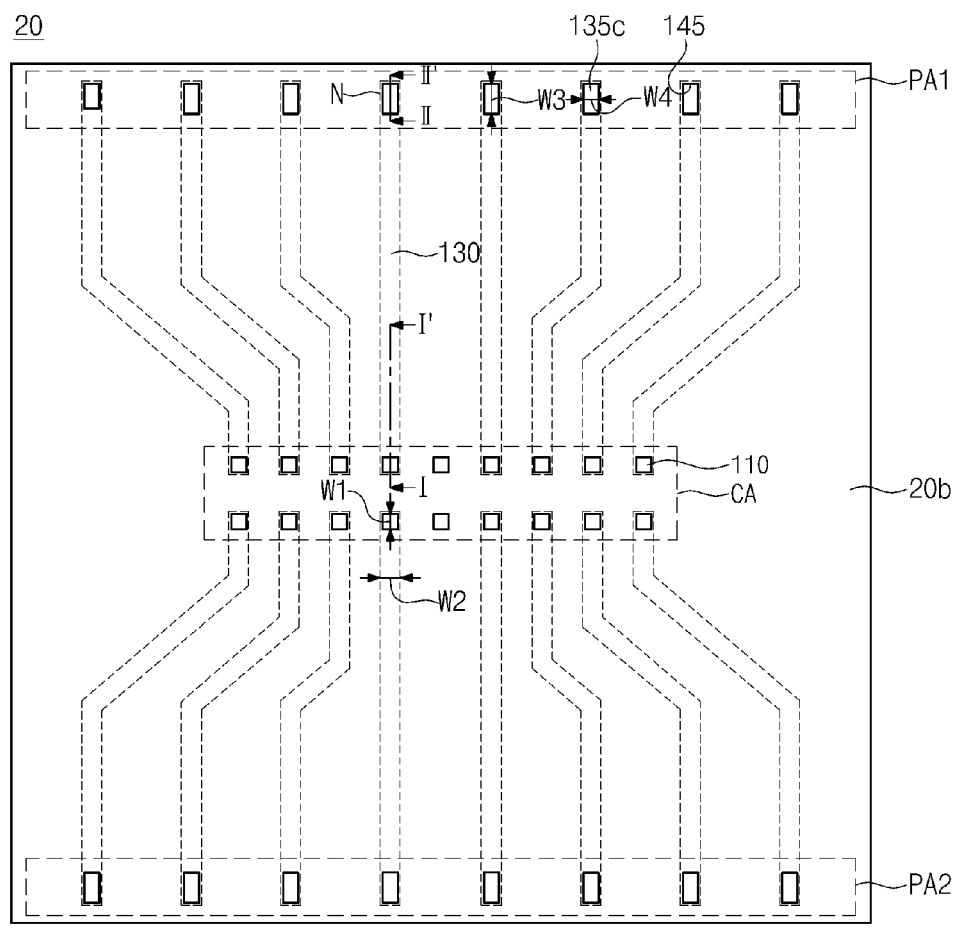
FIG. 2 is a plan view schematically illustrating a second surface of a first semiconductor chip according to an example embodiment of the inventive concepts.

FIG. 1 is a sectional view illustrating a semiconductor package according to an example embodiment of the inventive concepts. FIG. 2 is a plan view schematically illustrating a second surface of a first semiconductor chip according to an example embodiment of the inventive concepts.

Referring to FIGS. 1 and 2, a first semiconductor chip 20 may be mounted on a package substrate 10. As an example, the package substrate 10 may be a printed circuit board (PCB). The package substrate 10 may include circuit patterns (not shown) provided on one or both of top and bottom surfaces thereof. At least one of the circuit patterns may be electrically connected to first outer pads 2, which may be provided on the bottom surface of the package substrate 10. Outer terminals 4 (e.g., solder bumps or solder balls) may be respectively attached on the first outer pads 2 to electrically connect the package substrate 10 to an external device. At least one other of the circuit patterns may be electrically connected to second outer pads 6, which may be provided on the top surface of the package substrate 10.

The first semiconductor chip 20 may have a first surface 20a facing the package substrate 10 and a second surface 20b facing the first surface 20a. The first semiconductor chip 20 may include a center area CA and first and second peripheral areas PA1 and PA2. The center area CA may be positioned at a region including a center of the second surface 20b of the first semiconductor chip 20. The first and second peripheral areas PA1 and PA2 may be positioned adjacent to opposite sides of the first semiconductor chip 20, respectively. The center area CA may be disposed between the first and second peripheral areas PA1 and PA2.

The first semiconductor chip 20 may include a first integrated circuit IC1, center pads 110, and redistribution layers 130. The first integrated circuit IC1 may be provided in a portion of the first semiconductor chip 20 positioned adjacent to the second surface 20b. The center pads 110 may be electrically connected to the first integrated circuit IC1. When viewed in a plan view, the center pads 110 may be disposed on the center area CA.

The redistribution layers 130 may be disposed on the center pads 110. The redistribution layers 130 may include pad portions 135c. The pad portions 135c may be electrically connected to the first integrated circuit IC1 via the center pads 110. The pad portions 135c may be provided on the first and second peripheral areas PA1 and PA2. The pad portions 135c may be exposed to the outside. The redistribution layers 130 may allow signals from the first and second peripheral areas PA1 and PA2 to be applied to the center pads 110 of the center area CA through the pad portions 135c.

The inventive concepts are not limited to the illustrated example of the center pads 110 and the redistribution layers 130. Example embodiments of the inventive concepts may be variously changed in consideration of a type or use of a semiconductor package.

The first semiconductor chip 20 may be one of memory chips (e.g., DRAM chip or FLASH memory chip). The first integrated circuit IC1 may include memory cells for storing data and a control and/or power circuit for controlling operations of the memory cells.

The first semiconductor chip 20 may be attached to the package substrate 10 using a first adhesive layer 15. The first adhesive layer 15 may be an insulating layer or a tape, which contains, for example, an epoxy or silicone-based material.

Wires 8 may be provided to electrically connect the pad portions 135c of the first semiconductor chip 20 to the second outer pads 6 of the package substrate 10, respectively. The first semiconductor chip 20 may communicate with an external controller (not shown) through the wires 8. The wires 8 may be used to transmit various data (e.g., control signals containing address and command data, voltage signals, and/or any other data) to the first semiconductor chip 20 from the controller. Also, the wires 8 may be used to transmit data, which are read out from the memory cells of the first semiconductor chip 20, to the controller.

A mold layer 9 may be provided on the package substrate 10 to cover the first semiconductor chip 20 and the wires 8. The mold layer 9 may protect the first semiconductor chip 20 and the wires 8 against external environment. The mold layer 9 may include an epoxy molding compound material.

Figure 3:
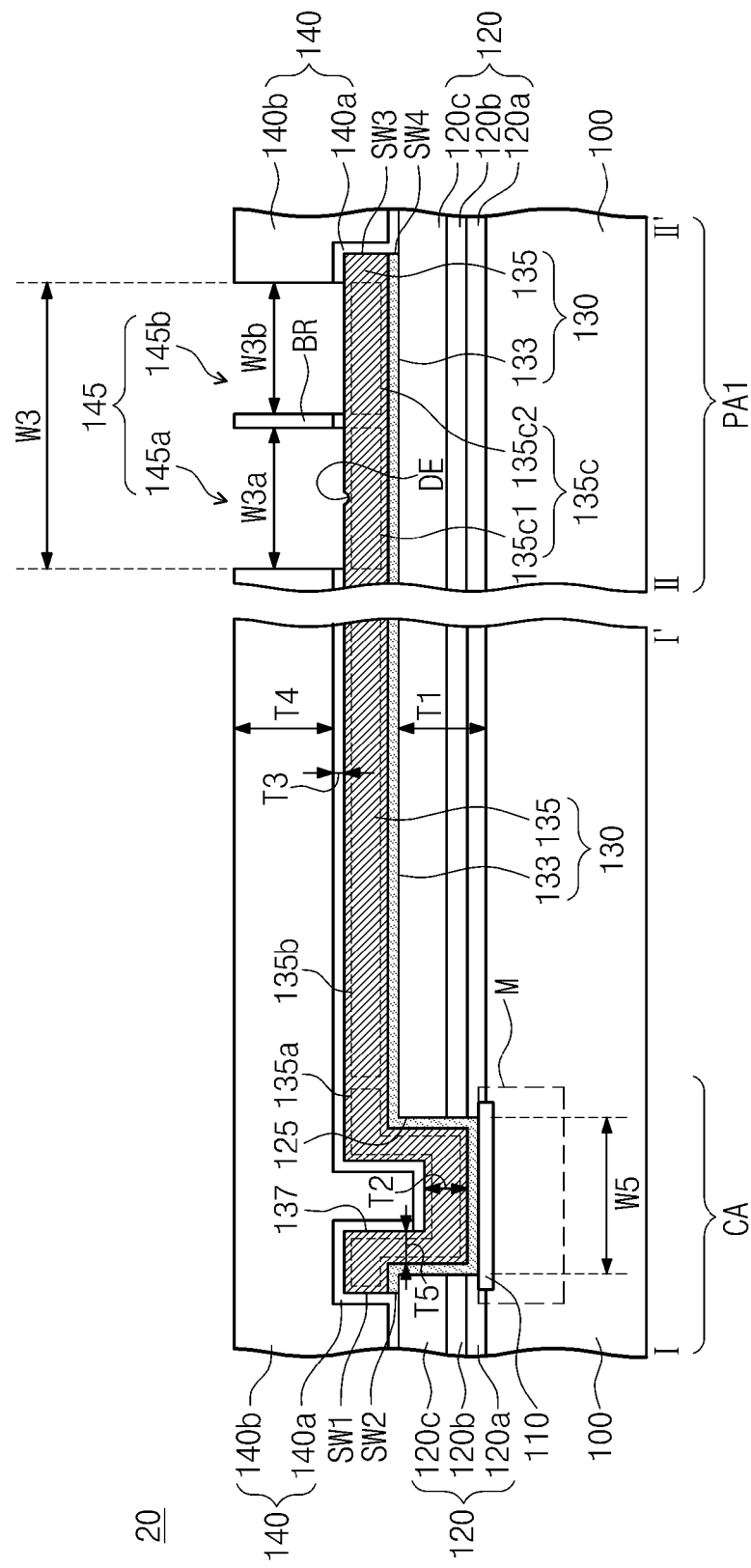
FIG. 3 is a sectional view of sections, which are respectively taken along lines I-I' and II-II' of FIG. 2, and illustrates a first semiconductor chip according to an example embodiment of the inventive concepts.
Figure 4:
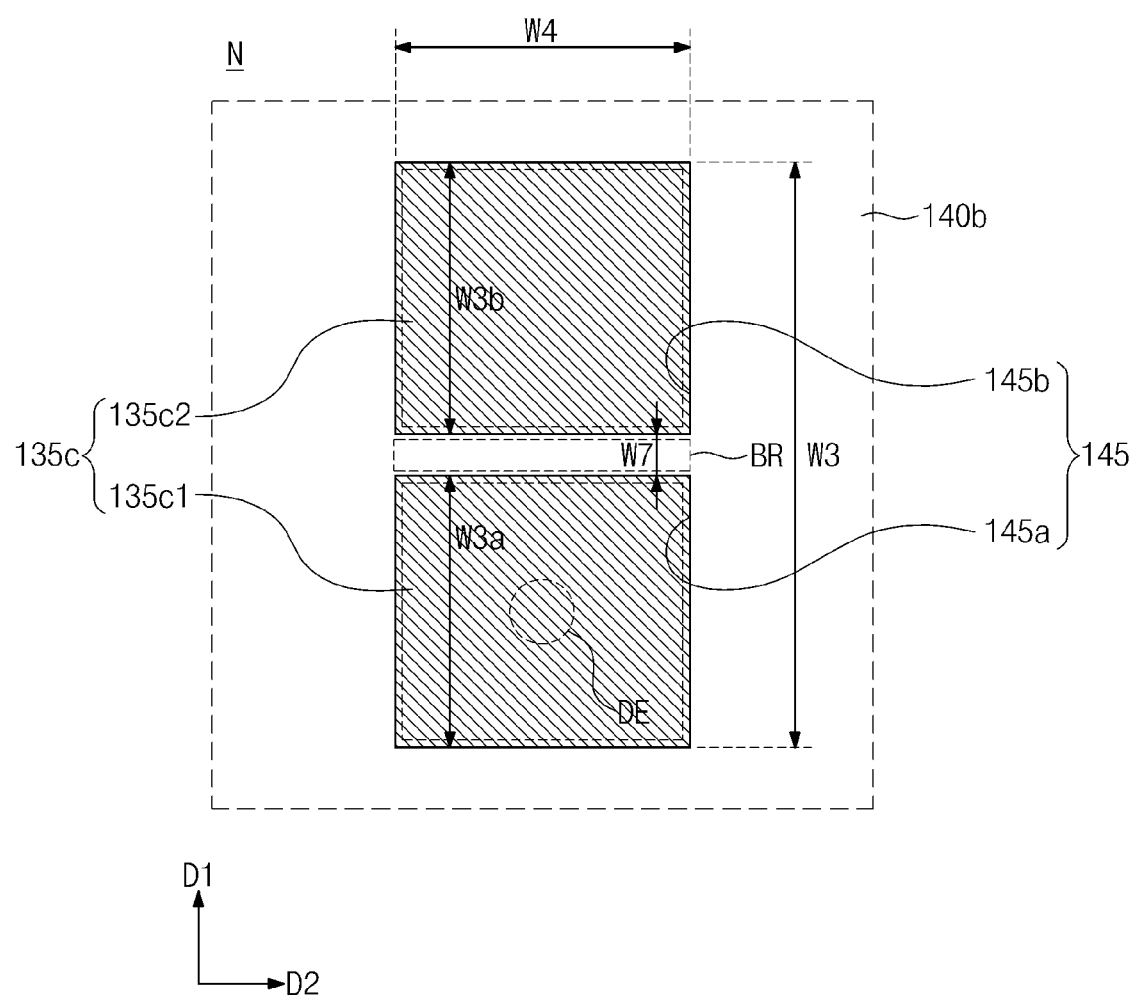
FIG. 4 is an enlarged plan view of a region N of FIG. 2.
Figure 5:
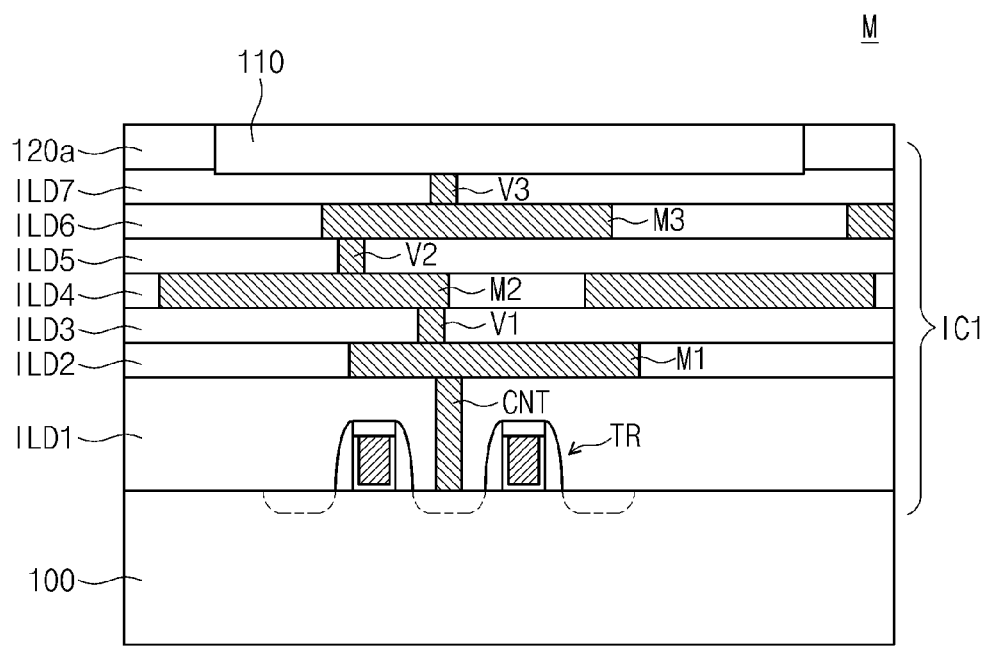
FIG. 5 is an enlarged sectional view of a region M of FIG. 3.

FIG. 3 is a sectional view of sections, which are respectively taken along lines I-I' and II-II' of FIG. 2, and illustrates a first semiconductor chip according to an example embodiment of the inventive concepts. FIG. 4 is an enlarged plan view of a region N of FIG. 2. FIG. 5 is an enlarged sectional view of a region M of FIG. 3. In the following description, the first semiconductor chip 20 will be described in more detail, without repeating an overlapping description of the semiconductor package previously described with reference to FIGS. 1 and 2.

Referring to FIGS. 2 through 5, the center pads 110 may be disposed on the center area CA of a semiconductor substrate 100. The semiconductor substrate 100 may be a silicon wafer, a germanium wafer, or a silicon-germanium wafer. The center pads 110 may be arranged to form two columns within the center area CA, but the inventive concepts may not be limited thereto. The center pads 110 may be formed of or include a conductive material (e.g., aluminum (Al)). At least one of the center pads 110 may have a first width W1, when measured in a first direction D1 parallel to a top surface of the semiconductor substrate 100. In some example embodiments, the first width W1 may range from about 5 µm to about 50 µm. Hereinafter, one of the center pads 110 will be described as an example of the center pads 110, for concise description.

The center pad 110 may be electrically connected to the first integrated circuit IC1 in the first semiconductor chip 20. Referring back to FIG. 5, the first integrated circuit IC1 may be disposed on the semiconductor substrate 100. The first integrated circuit IC1 may include a plurality of transistors TR, a plurality of metal layers M1-M3, and a plurality of vias V1-V3.

Each of the transistors TR may include a gate electrode and impurity regions provided at both side of the gate electrode. The impurity regions may be doped regions, which may be formed by injecting impurities into the semiconductor substrate 100. Each of the transistors TR may be used as a part of the memory cells or as a part of the control and/or power circuit for controlling operations of the memory cells.

First to seventh interlayered insulating layers ILD1-ILD7 may be sequentially stacked on the semiconductor substrate 100. The first interlayered insulating layer ILD1 may cover the transistors TR. A contact CNT may pass through the first interlayered insulating layer ILD1 and may be connected to one of the impurity regions of the transistors TR.

A first metal layer M1, a second metal layer M2, and a third metal layer M3 may be provided in the second interlayered insulating layer ILD2, the fourth interlayered insulating layer ILD4, and the sixth interlayered insulating layer ILD6, respectively. The center pad 110 may be provided on the seventh interlayered insulating layer ILD7. A first via V1 may be provided between the first and second metal layers M1 and M2, a second via V2 may be provided between the second and third metal layers M2 and M3, and a third via V3 may be provided between the third metal layer M3 and the center pad 110. The center pad 110 may be electrically connected to the transistors TR through the metal layers (M1-M3) and the vias V1-V3.

Referring back to FIGS. 2 and 3, a lower insulating structure 120 may be disposed on a top surface of the semiconductor substrate 100. The lower insulating structure 120 may partially cover the center pad 110. The lower insulating structure 120 may have a first thickness T1. As an example, the first thickness T1 may range from about 1 µm to about 12 µm.

Contact hole 125 may penetrate the lower insulating structure 120 and expose the remaining portion of the center pad 110. The contact hole 125 may have a fifth width W5, when measured in the first direction D1. The fifth width W5 may be smaller than the first width W1. For example, the fifth width W5 may range from about 5 µm to about 50 µm.

The lower insulating structure 120 may include first to third lower insulating layers 120a, 120b, and 120c, which are sequentially stacked on the semiconductor substrate 100. For example, the second lower insulating layer 120b may be interposed between the first and third lower insulating layers 120a and 120c. Here, the third lower insulating layer 120c may have a thickness greater than the first lower insulating layer 120a and/or the second lower insulating layer 120b.

Each of the first to third lower insulating layers 120a, 120b, and 120c may be formed of or include an inorganic insulating layer (e.g., silicon nitride, silicon oxide, or silicon oxynitride). In the case where a conductive pattern 135 is formed by a subsequent plating process, the lower insulating structure 120 may include a polymer layer (e.g., polyimide) because there is a difficulty to perform a metal plating process on an inorganic insulating layer. However, in the case that the conductive pattern 135 is formed by a deposition and patterning process, the lower insulating structure 120 may include an inorganic insulating layer. As an example, each of the first and third lower insulating layers 120a and 120c may include a silicon oxide layer, and the second lower insulating layer 120b may include a silicon nitride layer. Here, the first semiconductor chip 20 may be a DRAM chip.

The redistribution layer 130 may be provided on the lower insulating structure 120 to fill the contact hole 125 and be electrically connected to the center pad 110. In some example embodiments, as shown in FIG. 2, a plurality of redistribution layers 130 may be provided on the lower insulating structure 120. When viewed in a plan view, each of the redistribution layers 130 may be a line-shaped structure extending from the center pads 110 in the first direction D1. Some of the redistribution layers 130 may extend in a direction opposite to the first direction D1. For example, the redistribution layers 130 may extend from the center area CA to the first peripheral area PA1 or from the center area CA to the second peripheral area PA2. At least one of the redistribution layers 130 may include a portion extending in a direction crossing the first direction D1. Accordingly, the redistribution layers 130 may be disposed to have end portions that are uniformly arranged on the first and second peripheral areas PA1 and PA2.

At least one of the redistribution layers 130 may have a second width W2, when measured in a second direction D2 crossing the first direction D1. The second direction D2 may be parallel to the top surface of the semiconductor substrate 100. As an example, each of the redistribution layers 130 may serve as a signal line, a power line, or a ground line. In some example embodiments, a width of each of the redistribution layers 130 may be determined in accordance with its assigned function. For example, the second width W2 may range from about 2 μm to about 200 μm.

The redistribution layer 130 may include a barrier pattern 133 and the conductive pattern 135 on the barrier pattern 133. The barrier pattern 133 may be interposed between the lower insulating structure 120 and the conductive pattern 135. The barrier pattern 133 may be overlapped with the conductive pattern 135, when viewed in a plan view. The barrier pattern 133 may inhibit or prevent metallic elements from being diffused from the conductive pattern 135 to the lower insulating structure 120, and for example, may be formed of or include at least one of Ti, TiN, Ta, or TaN. Further, the barrier pattern 133 may be configured to have a good wetting property with respect to the lower insulating structure 120 thereunder.

The conductive pattern 135 may include a contact portion 135a filling the contact hole 125, a conductive line portion 135b provided on the lower insulating structure 120 and extended in the first direction D1, and a pad portion 135c connected to the conductive line portion 135b. The contact portion 135a, the conductive line portion 135b, and the pad portion 135c may be connected to form a single body (e.g., the conductive pattern 135). The conductive pattern 135 may include a metallic material, on which a deposition and patterning process can be performed. As an example, the conductive pattern 135 may contain aluminum (Al).

The contact portion 135a may have a second thickness T2 at a bottom of the contact hole 125, when measured in a direction perpendicular to the top surface of the semiconductor substrate 100. In addition, the contact portion 135a in the contact hole 125 may have a fifth thickness T5 in the first direction D1 or the second direction D2. Here, the second thickness T2 may be greater than the fifth thickness T5. For example, the second thickness T2 may range from about 1 μm to about 8 μm. The contact portion 135a filling the contact hole 125 may define a recess region 137.

The conductive line portion 135b may be positioned between the contact portion 135a and the pad portion 135c. Similar to the redistribution layers 130 previously described with reference to FIG. 2, the conductive line portion 135b may be a line-shaped structure extending in the first direction D1. The conductive line portion 135b may electrically connect the pad portion 135c on the first peripheral area to the contact portion 135a on the center area CA.

An end portion of the contact portion 135a may have a first sidewall SW1. An end portion of the barrier pattern 133 adjacent to the contact portion 135a may have a second sidewall SW2. Here, the first and second sidewalls SW1 and SW2 may be aligned to each other, when viewed in a plan view. An end portion of the pad portion 135c may have a third sidewall SW3. Other end portion of the barrier pattern 133 adjacent to the pad portion 135c may have a fourth sidewall SW4. Here, the third and fourth sidewalls SW3 and SW4 may be aligned to each other, when viewed in a plan view.

Referring back to FIGS. 3 and 4, the pad portion 135c may include a test region 135c1 and a bonding region 135c2. A test probe may come into contact with the test region 135c1, when the first semiconductor chip 20 is tested. The test probe may apply a test signal to the test region 135c1. In this case, the test signals may be input to the first integrated circuit IC1 through the redistribution layer 130 and the center pad 110. In the case where the test probe comes into contact with the top surface of the test region 135c1, a dent DE may be formed on the top surface of the test region 135c1, as will be described in more detail below. The bonding region 135c2 may be a region, to which the wires 8 are bonded.

The bonding region 135c2 may be spaced apart from the test region 135c1 in the first direction D1. For example, the test region 135c1 and the bonding region 135c2 may be arranged, or aligned to each other, in the first direction D1. The test region 135c1 may have a first sub width W3a in the first direction D1, and the bonding region 135c2 may have a second sub width W3b in the first direction D1. The second sub width W3b may be substantially equal to or greater than the first sub width W3a. The second sub width W3b may allow the wire bonding process to be performed on the bonding region 135c2, thereby avoiding or mitigating problems caused by the dent DE formed in the test region 135c1. For example, each of the first and second sub widths W3a and W3b may range from about 100 μm to about 300 μm.

In some example embodiments, the test region 135c1 and the bonding region 135c2 may have substantially the same planar shape and size. Although not shown, according to some example embodiments, the test region 135c1 and the bonding region 135c2 may have different shapes and/or different sizes.

The pad portion 135c may have third and fourth widths W3 and W4 in the first and second directions D1 and D2, respectively. Here, the third width W3 may be about 1.5-3 times the fourth width W4.

An upper insulating structure 140 may be provided on the redistribution layer 130 and the lower insulating structure 120. The upper insulating structure 140 may include an upper insulating layer 140a and a polymer layer 140b. The upper insulating structure 140 may be sequentially stacked on the semiconductor substrate 100. The upper insulating layer 140a may cover the redistribution layer 130. For example, the upper insulating layer 140a may cover the first and third sidewalls SW1 and SW3 of the conductive pattern 135 and the second and fourth sidewalls SW2 and SW4 of the barrier pattern 133. The polymer layer 140b may be on the redistribution layer 130 with the upper insulating layer 140a interposed therebetween. The upper insulating structure 140 may protect the redistribution layer 130 against external environment and inhibit or prevent a short circuit from being formed between the redistribution layers 130.

In some example embodiments, the upper insulating layer 140a may include an inorganic insulating layer containing silicon (e.g., a silicon nitride layer, a silicon oxide layer, or a silicon oxynitride layer). The polymer layer 140b may be formed of or include an organic insulating layer (e.g., at least one of polyimide, fluoro carbon, resin, and synthetic rubber). The upper insulating layer 140*a* may have a third thickness T3, and the polymer layer 140*b* may have a fourth thickness T4. Here, the fourth thickness T4 may be greater than the third thickness T3. As an example, the third thickness T3 may range from about 0.1 μm to about 3 μm, and the fourth thickness T4 may range from about 0.3 μm to about 6 μm.

A first opening 145 may penetrate the upper insulating structure 140 and expose the pad portion 135*c*. In some example embodiments, as shown in FIG. 2, a plurality of first openings 145 may be provided on the first and second peripheral areas PA1 and PA2 to expose the pad portions 135*c*, respectively.

Referring back to FIGS. 3 and 4, the first opening 145 may include a first sub-opening 145*a* exposing the test region 135*c*1 and a second sub-opening 145*b* exposing the bonding region 135*c*2. The upper insulating structure 140 may include a separation pattern BR that is disposed on a region between the test region 135*c*1 and the bonding region 135*c*2. For example, the first opening 145 may be divided into the first and second sub-openings 145*a* and 145*b* by the separation pattern BR.

The separation pattern BR may have a seventh width W7, when measured in the first direction D1. When the wire bonding process is performed to connect the first semiconductor chip 20 to an external device (e.g., the package substrate 10 of FIG. 1), a wire bonding system may recognize a position of the bonding region 135*c*2 and then bond a wire 8 onto the bonding region 135*c*2. Here, a range of the seventh width W7 may allow the wire bonding system to distinguish the bonding region 135*c*2 from the test region 135*c*1 with relative ease. As an example, the seventh width W7 may range from about 1 μm to about 30 μm.

In conventional technologies, when the test probe comes into contact with a pad to test circuits in a semiconductor chip, the contact of the test probe may cause a defect (e.g., the dent DE) on the pad. Furthermore, the defect may result in a connection failure of a wire, in a subsequent wire bonding process for forming the wire on the pad. By contrast, according to some example embodiments of the inventive concepts, the semiconductor chip may include the pad portion 135*c* that is divided into the test region 135*c*1 and the bonding region 135*c*2. Accordingly, it is possible to selectively perform the wire bonding process on the bonding region 135*c*2 and thereby inhibit or prevent the wire connection failure from occurring after testing the semiconductor chip.

FIGS. 6 through 11 are sectional views, each of which illustrates sections taken along lines I-I' and II-II' of FIG. 2, and illustrate a method of fabricating a first semiconductor chip according to an example embodiment of the inventive concepts.

Referring to FIGS. 2 and 6, the first integrated circuit IC1 may be formed on the semiconductor substrate 100. The first integrated circuit IC1 may include a plurality of transistors TR, a plurality of metal layers M1-M3, and a plurality of vias V1-V3 as illustrated in FIG. 5.

The center pads 110 may be formed on the center area CA of the he semiconductor substrate 100. The center pads 110 may be electrically connected to the first integrated circuit IC1. Hereinafter, one of the center pads 110 will be described as an example of the center pads 110, for concise description.

The lower insulating structure 120 may be formed to cover the center pad 110. The lower insulating structure 120 may be formed to have the first thickness T1. As an example, the first thickness T1 may range from about 1 μm to about 12 μm.

For example, the lower insulating structure 120 may be formed by sequentially forming the first lower insulating layer 120*a*, the second lower insulating layer 120*b*, and the third lower insulating layer 120*c* on the top surface of the semiconductor substrate 100. At least one or each of the first to third lower insulating layers 120*a*, 120*b*, and 120*c* may be formed by an atomic layer deposition (ALD) process or a chemical vapor deposition (CVD) process. In some example embodiments, the first and third lower insulating layers 120*a* and 120*c* may be formed of a silicon oxide layer and the second lower insulating layer 120*b* may be formed of a silicon nitride layer.

Referring to FIGS. 2 and 7, the lower insulating structure 120 may be patterned to form the contact hole 125 exposing the center pad 110. The patterning of the lower insulating structure 120 may include forming a first photoresist pattern (not shown) to have an opening overlapped with the center pad 110 in a plan view and etching the lower insulating structure 120 using the first photoresist pattern as an etch mask. The contact hole 125 may be formed to have the fifth width W5. For example, the fifth width W5 may range from about 5 μm to about 50 μm.

Figure 8:
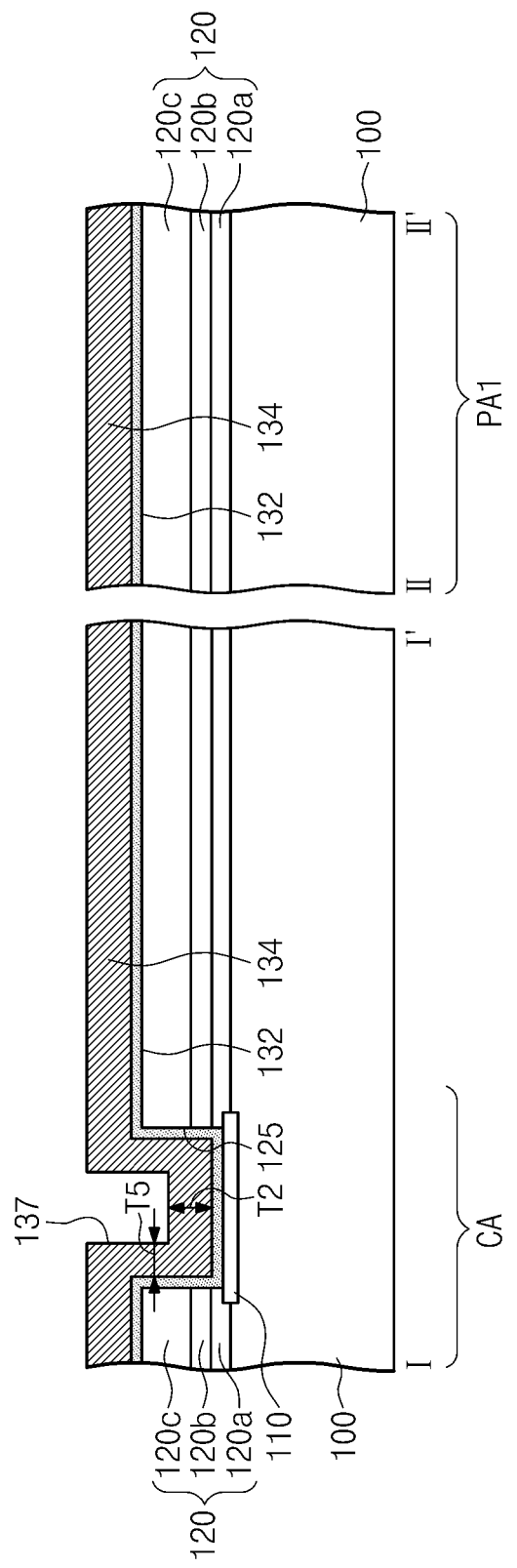

Referring to FIGS. 2 and 8, a barrier layer 132 may be formed on the top surface of the lower insulating structure 120, and a conductive layer 134 may be formed on the barrier layer 132. The barrier layer 132 and the conductive layer 134 may be formed to fill the contact hole 125. The barrier layer 132 may be formed to cover the center pad 110. The conductive layer 134 may be formed to have a thickness that is smaller than half a width of the contact hole 125, and thereby to define the recess region 137 on or in the contact hole 125.

The barrier layer 132 and the conductive layer 134 may be formed by a physical vapor deposition (PVD) process. When measured in a direction perpendicular to the top surface of the semiconductor substrate 100, the conductive layer 134 in the contact hole 125 may be formed to have the second thickness T2. The conductive layer 134 in the contact hole 125 may have the fifth thickness T5, when measured in the first direction D1 or the second direction D2. In the case where the conductive layer 134 is formed by a PVD process with a low step coverage property, the second thickness T2 may be greater than the fifth thickness T5.

In some example embodiments, the barrier layer 132 may be formed of or include at least one of Ti, TiN, Ta, or TaN. The conductive layer 134 may be formed of or include a metallic material (e.g., containing aluminum (Al)).

Figure 9:
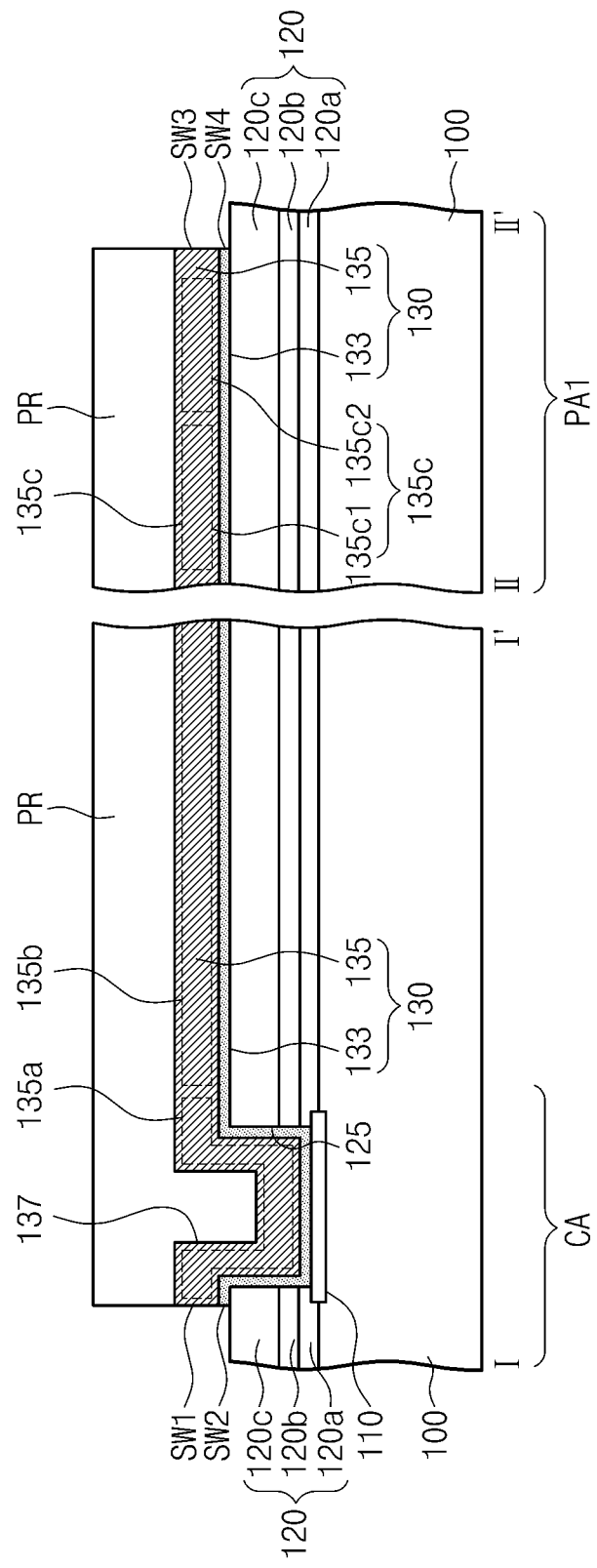

Referring to FIGS. 2 and 9, a second photoresist pattern PR may be formed on the conductive layer 134. In some example embodiments, a plurality of second photoresist patterns PR may define positions and shapes of the redistribution layers 130 described with reference to FIGS. 2 and 3.

The conductive layer 134 and the barrier layer 132 may be sequentially etched using the second photoresist pattern PR as an etch mask to form the redistribution layer 130. The conductive layer 134 and the barrier layer 132 may be etched using a dry etching process. As an example, an etching gas containing BCl3 and/or SF6 may be used for the dry etching process, but the inventive concepts may not be limited thereto. The redistribution layer 130 may include the barrier pattern 133 and the conductive pattern 135 on the barrier pattern 133. The conductive pattern 135 may include the contact portion 135*a*, the conductive line portion 135*b*, and the pad portion 135c. The pad portion 135c may include the test region 135c1 and the bonding region 135c2.

In the case where the second photoresist pattern PR is used as a common mask for forming the conductive pattern 135 and the barrier pattern 133, the conductive pattern 135 and the barrier pattern 133 may overlap with each other when viewed in a plan view. For example, the first sidewall SW1 of the contact portion 135a may be aligned with the second sidewall SW2 of the barrier pattern 133 adjacent to the contact portion 135a. Also, the third sidewall SW3 of the pad portion 135c may be aligned with the fourth sidewall SW4 of the barrier pattern 133 adjacent to the pad portion 135c.

Figure 10:
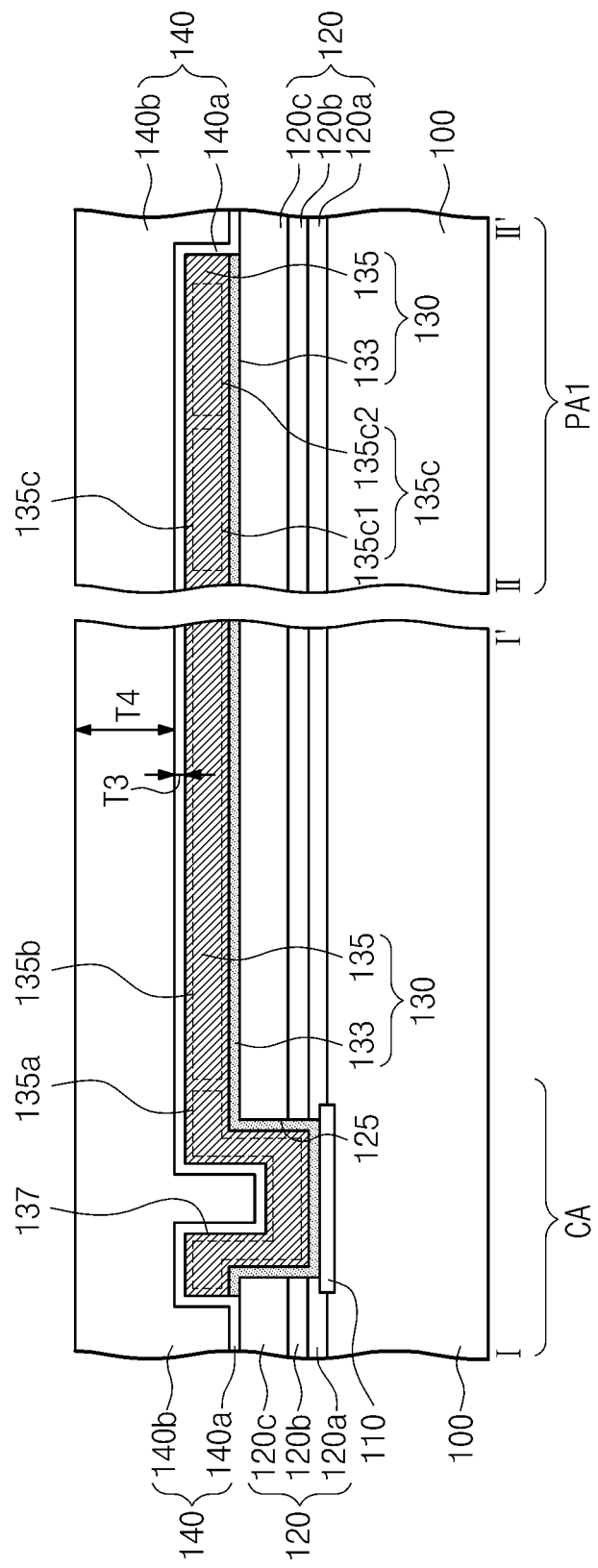

Referring to FIGS. 2 and 10, the second photoresist pattern PR may be removed. Thereafter, the upper insulating structure 140 may be formed on the redistribution layer 130 and the lower insulating structure 120.

The upper insulating structure 140 may be formed by sequentially forming the upper insulating layer 140a and the polymer layer 140b on the top surface of the semiconductor substrate 100. The upper insulating layer 140a may be formed by an ALD or CVD process. The polymer layer 140b may be formed by coating a polymer material (e.g., at least one of polyimide, fluoro carbon, resin, or synthetic rubber) or a precursor thereof on the upper insulating layer 140a. The upper insulating layer 140a may be formed to have the third thickness T3, and the polymer layer 140b may be formed to have the fourth thickness T4. Here, the fourth thickness T4 may be greater than the third thickness T3.

Figure 11:
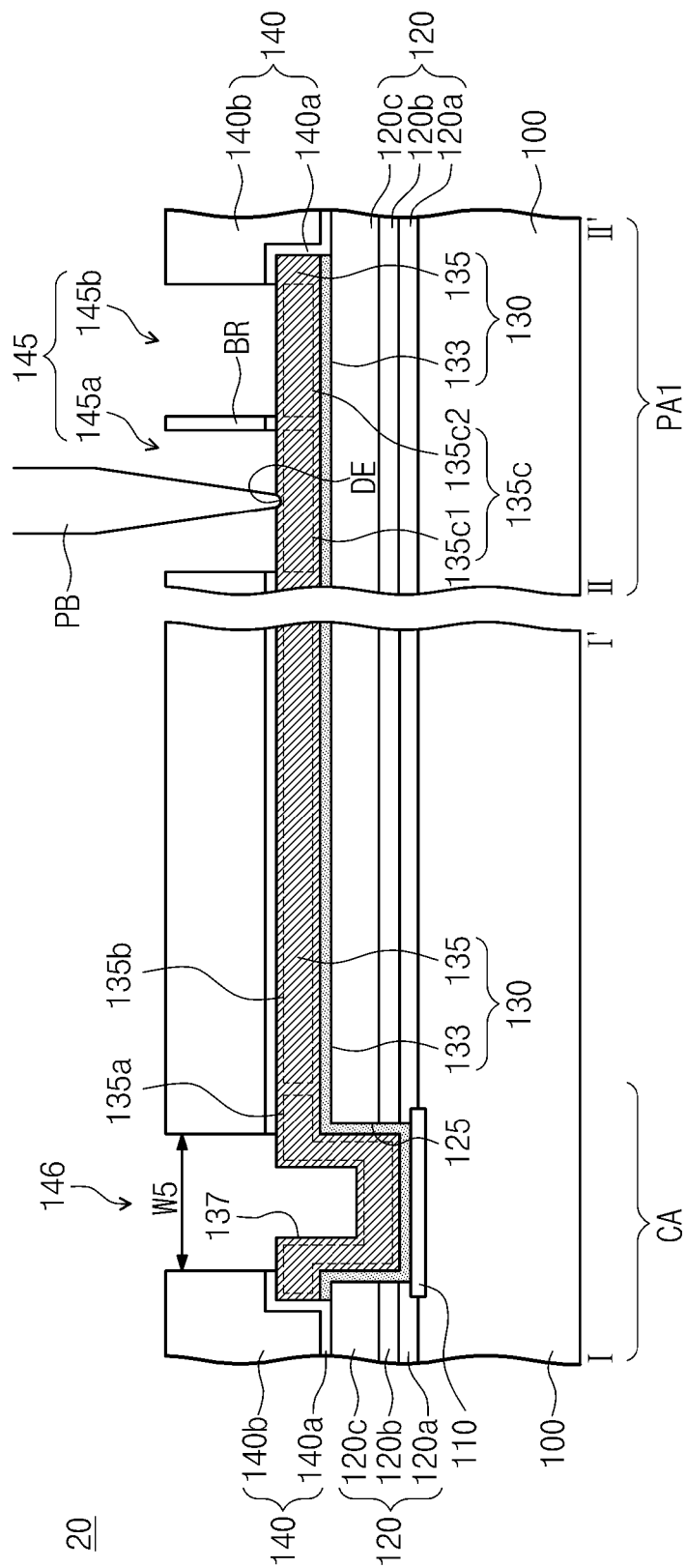

Referring to FIGS. 2 and 11, the upper insulating structure 140 may be patterned to form the first opening 145 exposing the pad portion 135c. The upper insulating structure 140 may be patterned by forming a third photoresist pattern (not shown) to have an opening overlapped with the pad portion 135c in a plan view and etching the upper insulating structure 140 using the third photoresist pattern as an etch mask. Here, the third photoresist pattern may be formed to mask portions of the upper insulating structure 140 corresponding to the test region 135c1 and the bonding region 135c2 so that the separation pattern BR may be formed on the region between the test region 135c1 and the bonding region 135c2 after patterning the upper insulating structure 140.

The first opening 145 may include the first sub-opening 145a exposing the test region 135c1 and the second sub-opening 145b exposing the bonding region 135c2. For example, the first opening 145 may be divided into the first and second sub-openings 145a and 145b by the separation pattern BR.

A test probe PB may come into contact with the test region 135c1 exposed by the first sub-opening 145a to apply a test signal to the first integrated circuit IC1. The test signal applied to the test region 135c1 may be input to the first integrated circuit IC1 through the redistribution layer 130 and the center pad 110. The use of the test probe PB may make it possible to check whether or not there is a failure in the first integrated circuit IC1. However, when the test probe PB contacts the test region 135c1, the dent DE may be formed at the test region 135c1. According to some example embodiments, the test probe PB contacts the test region 135c1, and the wire 8 is bonded to the bonding region 135c2. Thus the dent from may not be formed at the bonding region 135c2.

According to some example embodiments of the inventive concepts, the redistribution layer 130 may be formed of an inexpensive metal (e.g., aluminum), instead of gold or copper. Thus, production cost of a semiconductor chip and/or package fabricating process may be reduced. Further, an existing metal-patterning system may be used for the process of patterning the redistribution layer 130, and efficiency of the fabrication process may be improved. Furthermore, in the fabrication method according to some example embodiments of the inventive concepts, the test probe PB may contact the test region 135c1 and may not contact the bonding region 135c2. Thus, t a wire-connection failure may be inhibited or prevented from occurring on the bonding region 135c2.

Figure 12:
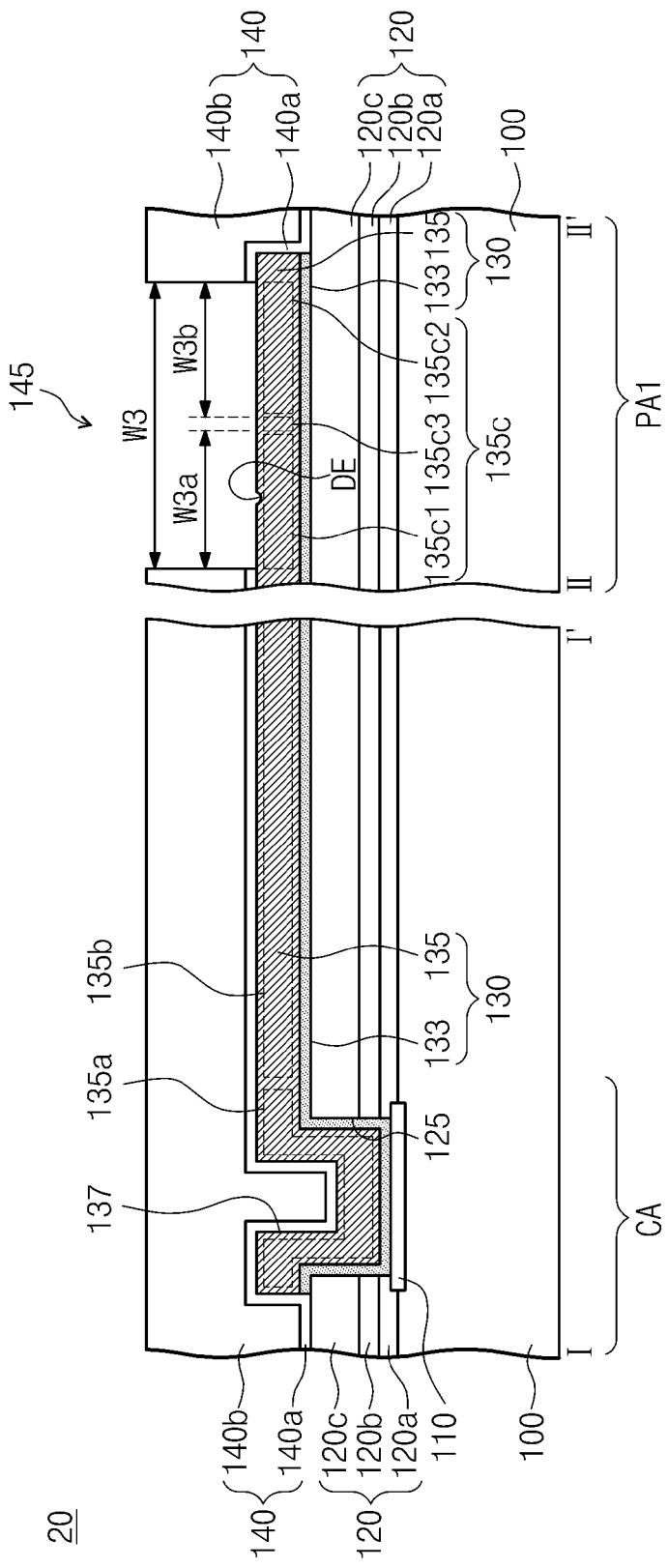
FIG. 12 is a sectional view of sections, which are respectively taken along lines I-I' and II-II' of FIG. 2, and illustrates a first semiconductor chip according to an example embodiment of the inventive concepts.
Figure 13:
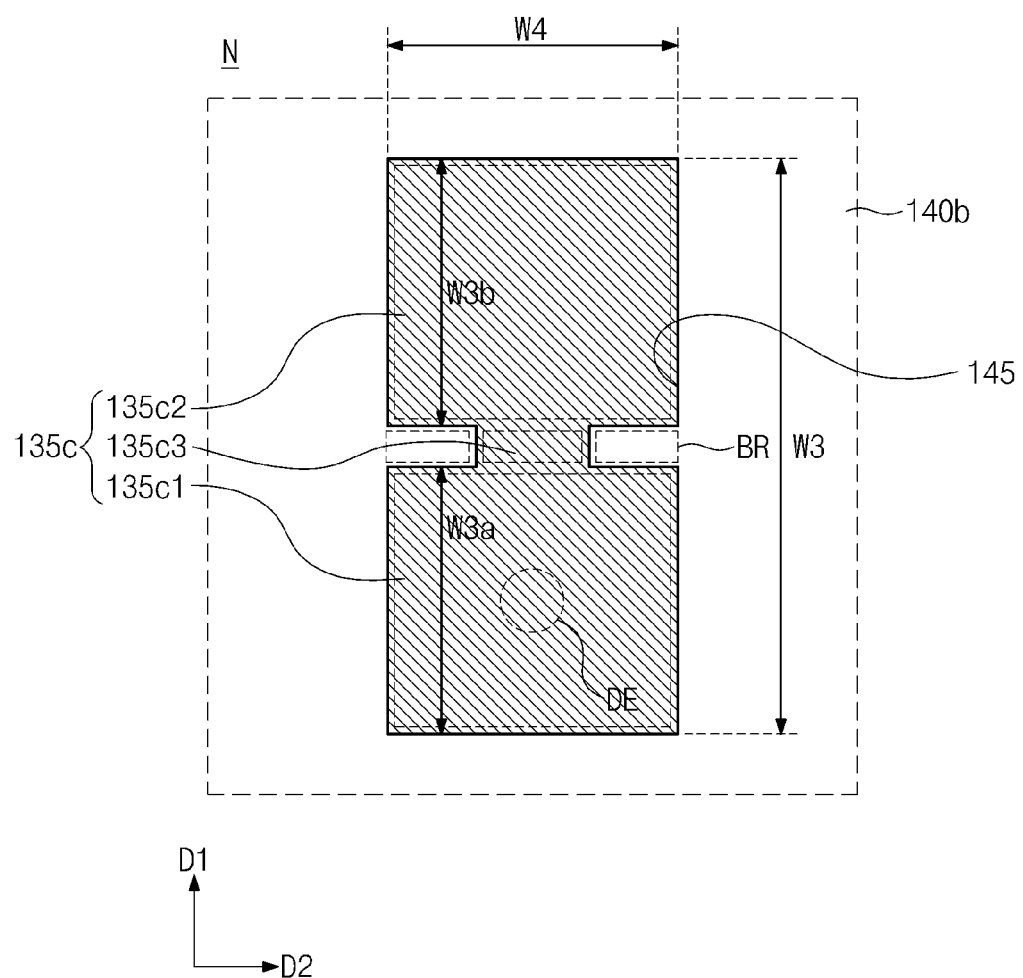
FIG. 13 is an enlarged plan view illustrating an example of the region N of FIG. 2.

FIG. 12 is a sectional view of sections, which are respectively taken along lines I-I' and II-II' of FIG. 2, and illustrates a first semiconductor chip according to an example embodiment of the inventive concepts. FIG. 13 is an enlarged plan view illustrating an example of the region N of FIG. 2. In the following description, an element of the first semiconductor chip previously described with reference to FIGS. 2 through 5 may be identified by a similar or identical reference number without repeating an overlapping description thereof, for the sake of brevity.

Referring to FIGS. 2, 12, and 13, the pad portion 135c may include the test region 135c1, the bonding region 135c2, and a bridge region 135c3 interposed between the test and bonding regions 135c1 and 135c2. The test region 135c1, the bonding region 135c2, and the bridge region 135c3 may be exposed to the outside by the first opening 145. When viewed in a plan view, the separation pattern BR may be divided into two patterns with the bridge region 135c3 interposed therebetween.

Figure 14:
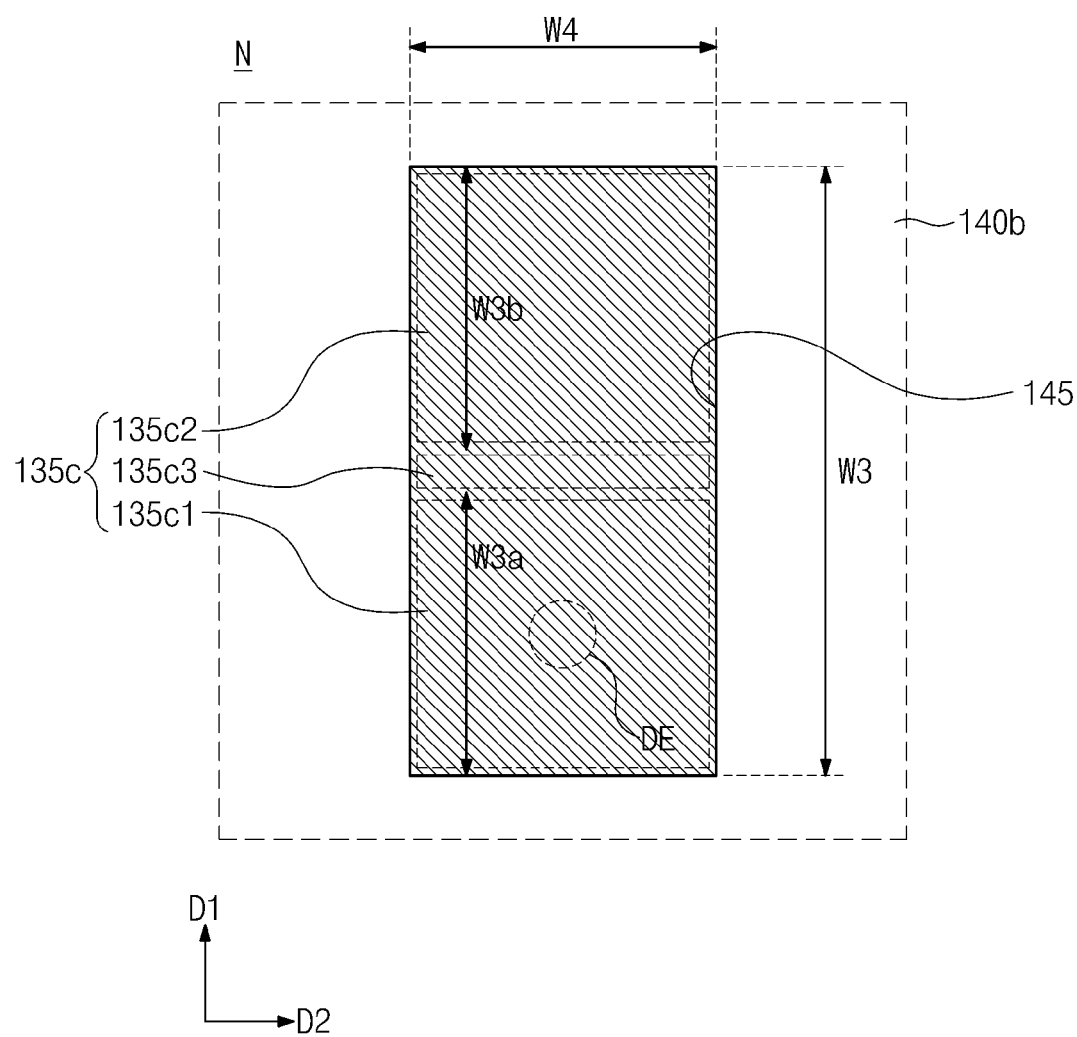
FIG. 14 is an enlarged plan view illustrating another example of the region N of FIG. 2.

FIG. 14 is an enlarged plan view illustrating another example of the region N of FIG. 2. Referring to FIGS. 2, 12, and 14, the upper insulating structure 140 may not have the separation pattern BR. Accordingly, the pad portion 135c may extend in the first direction D1 with a uniform width (e.g., the fourth width W4).

Figure 15:
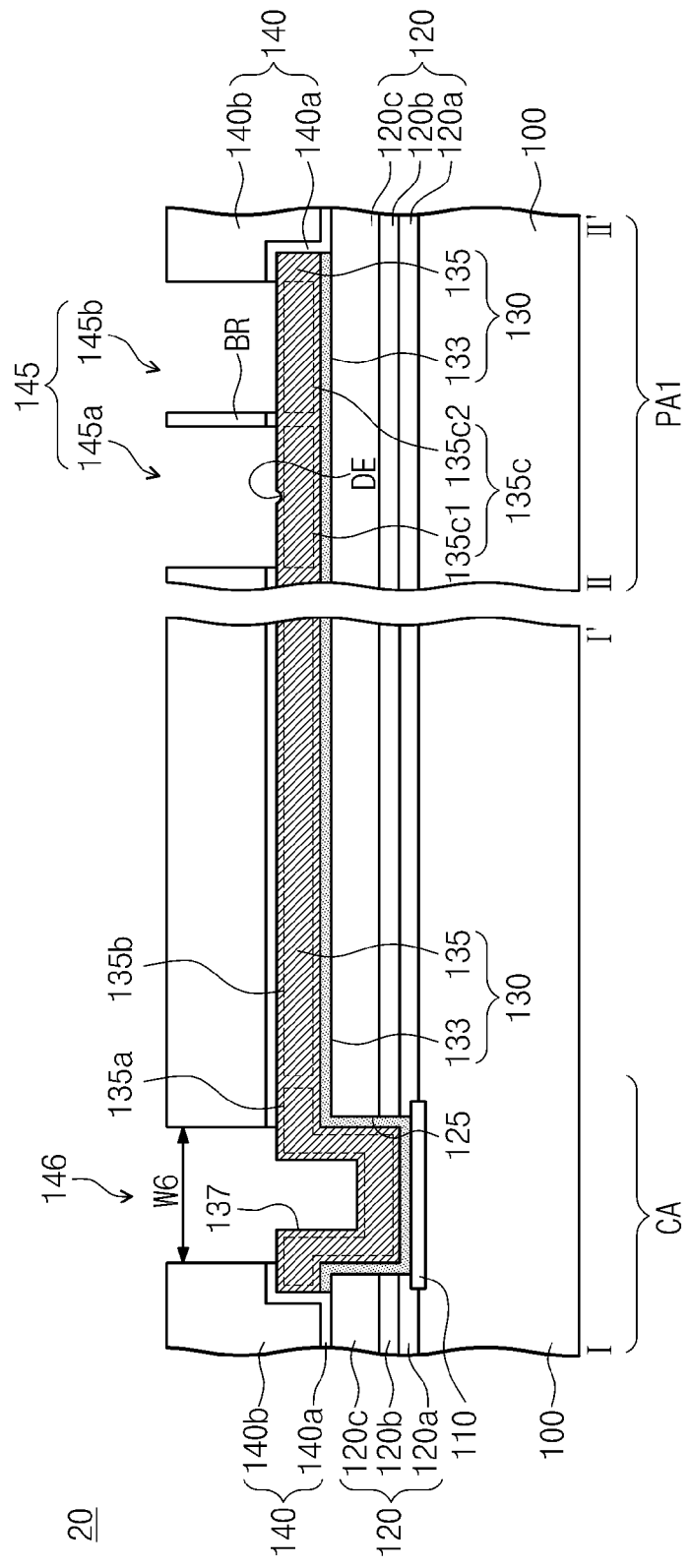
FIG. 15 is a sectional view of sections, which are respectively taken along lines I-I' and II-II' of FIG. 2, and illustrates a first semiconductor chip according to an example embodiment of the inventive concepts.

FIG. 15 is a sectional view of sections, which are respectively taken along lines I-I' and II-II' of FIG. 2, and illustrates a first semiconductor chip according to an example embodiment of the inventive concepts. In the following description, an element of the first semiconductor chip previously described with reference to FIGS. 2 through 5 may be identified by a similar or identical reference number without repeating an overlapping description thereof, for the sake of brevity.

Referring to FIGS. 2 and 15, a second opening 146 may be provided to penetrate the upper insulating structure 140 and to expose the contact portion 135a. The second opening 146 may have a sixth width W6. In some example embodiments, the sixth width W6 may range from about 10 μm to about 100 μm.

Although not shown, an additional outer terminal may be connected to the contact portion 135a through the second opening 146. Accordingly, this structure of the contact portion 135a, in conjunction with the pad portion 135c exposed by the first opening 145, may increase a degree of freedom in establishing a routing path with an external controller (not shown).

Figure 16:
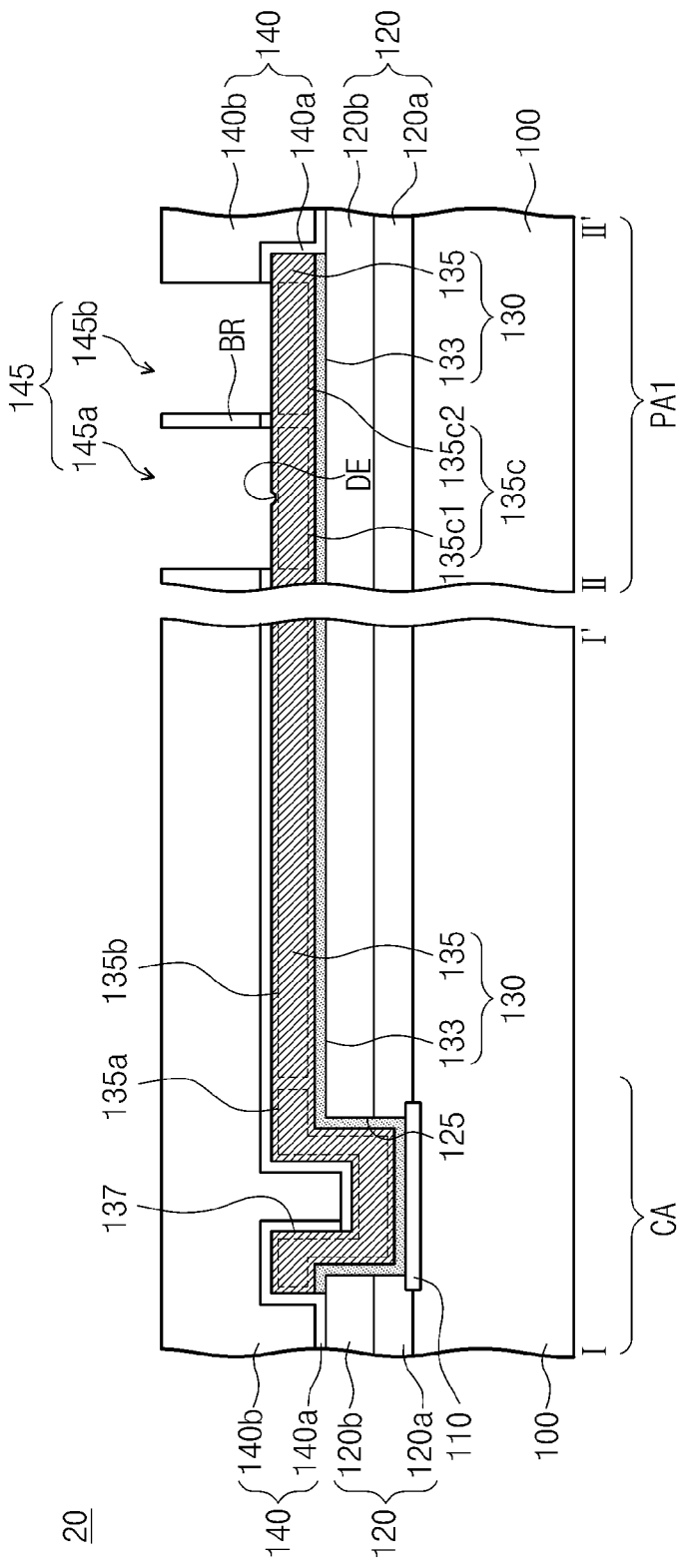
FIG. 16 is a sectional view of sections, which are respectively taken along lines I-I' and II-II' of FIG. 2, and illustrates a first semiconductor chip according to an example embodiment of the inventive concepts.

FIG. 16 is a sectional view of sections, which are respectively taken along lines I-I' and II-II' of FIG. 2, and illustrates a first semiconductor chip according to an example embodiment of the inventive concepts. In the following description, an element of the first semiconductor chip previously described with reference to FIGS. 2 through 5 may be identified by a similar or identical reference number without repeating an overlapping description thereof, for the sake of brevity.

Referring to FIGS. 2 and 16, the lower insulating structure 120 may include the first and second lower insulating layers 120a and 120b, which may be sequentially stacked on the semiconductor substrate 100. At least one or each of the first and second lower insulating layers 120a and 120b may be formed of or include an inorganic insulating layer (e.g., silicon nitride, silicon oxide, or silicon oxynitride). For example, the first lower insulating layer 120a may include a silicon nitride layer, and the second lower insulating layer 120b may include a silicon oxide layer.

Figure 17:
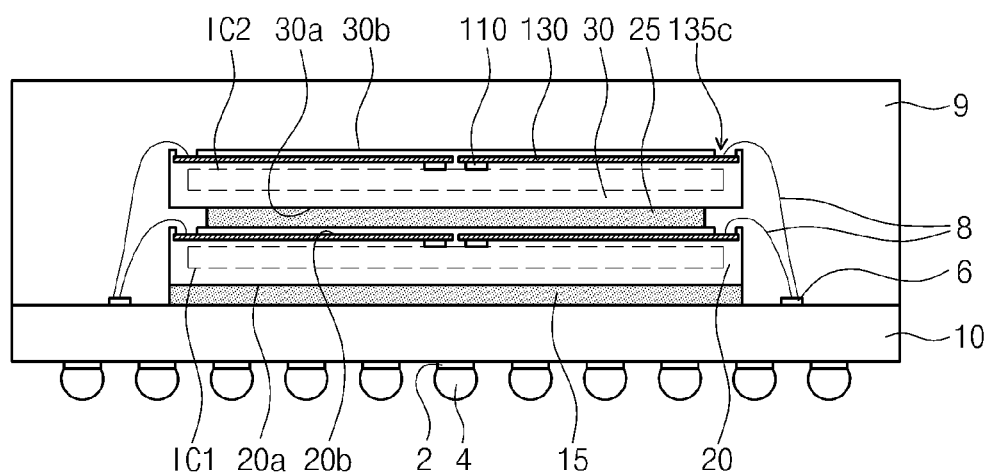
FIG. 17 is a sectional view illustrating a semiconductor package according to an example embodiment of the inventive concepts.

FIG. 17 is a sectional view illustrating a semiconductor package according to an example embodiment of the inventive concepts. In the following description, an element of the semiconductor package previously described with reference to FIGS. 1 and 2 may be identified by a similar or identical reference number without repeating an overlapping description thereof, for the sake of brevity.

Referring to FIG. 17, a first semiconductor chip 20 may be mounted on the package substrate 10, and a second semiconductor chip 30 may be mounted on the first semiconductor chip 20. The second semiconductor chip 30 may have a third surface 30a facing the first semiconductor chip 20 and a fourth surface 30b opposite to the third surface 30a.

The second semiconductor chip 30 may be a chip that is the same as or similar to the first semiconductor chip 20. For example, the second semiconductor chip 30 may have a second integrated circuit IC2, center pads 110 and redistribution layers 130. The redistribution layers 130 may include pad portions 135c. In some example embodiments, the second semiconductor chip 30 may be one of memory chips (e.g., DRAM chips or FLASH memory chips). The second integrated circuit IC2 may include memory cells for storing data and a control and/or power circuit for controlling operations of the memory cells.

The second semiconductor chip 30 may be attached to the first semiconductor chip 20 using a second adhesive layer 25. The second adhesive layer 25 may be an insulating layer or a tape (which contains, for example an epoxy or silicone-based material). The second adhesive layer 25 may have a top surface positioned at a level higher than the topmost level of wires 8 connected to the first semiconductor chip 20.

The wires 8 may respectively connect the pad portions 135c of the second semiconductor chip 30 to second outer pads 6 of the package substrate 10. The second semiconductor chip 30 may communicate with an external controller (not shown) through the wires 8.

The mold layer 9 may be provided on the package substrate 10 to cover the first and second semiconductor chips 20 and 30 and the wires 8. The mold layer 9 may protect the first and second semiconductor chips 20 and 30 and the wires 8 against external environment.

In some example embodiments, the semiconductor package may further include at least one semiconductor chip disposed on the second semiconductor chip 30, in addition to the first and second semiconductor chips 20 and 30.

Figure 18A:
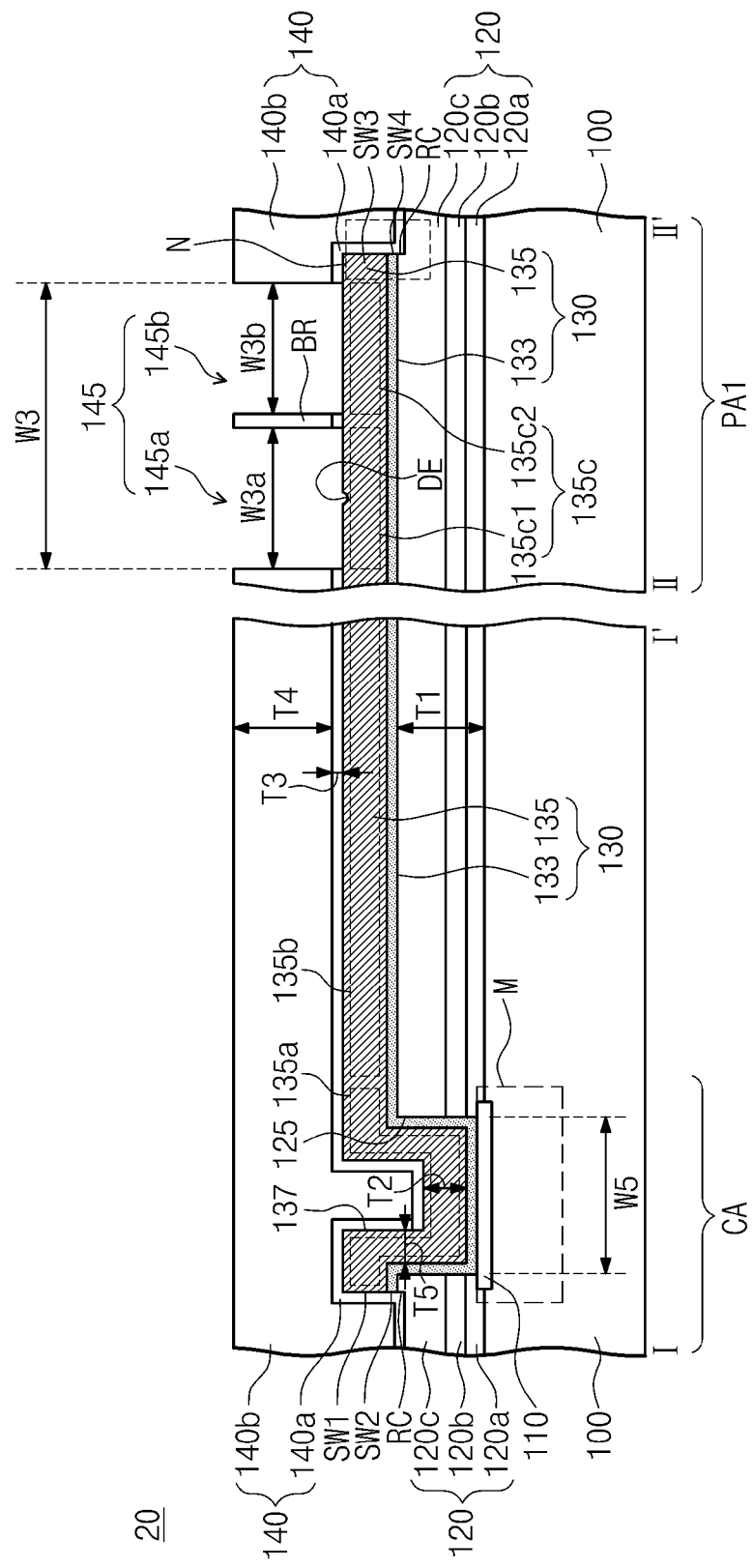
FIG. 18A is a sectional view of sections, which are respectively taken along lines I-I' and II-II' of FIG. 2, and illustrates a first semiconductor chip according to an example embodiment of the inventive concept.
Figure 18B:
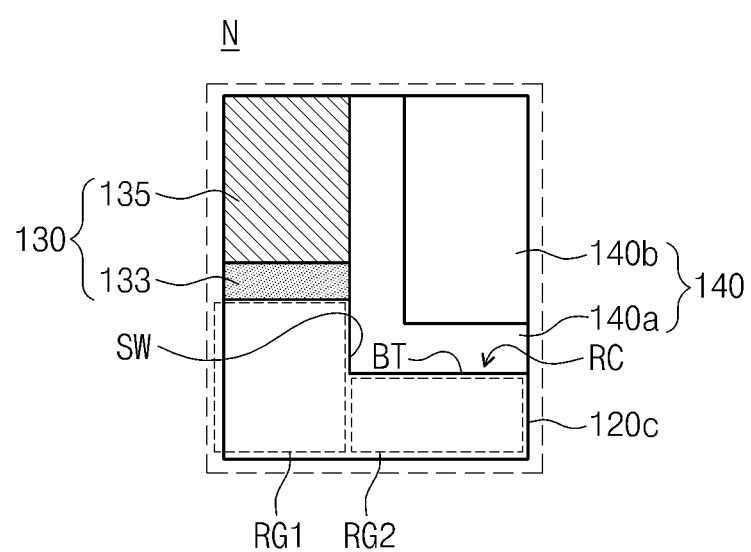
FIG. 18B is an enlarged sectional view of a region N of FIG. 18A.

FIG. 18A is a sectional view of sections, which are respectively taken along lines I-I' and II-II' of FIG. 2, and illustrates a first semiconductor chip according to an example embodiment of the inventive concept. FIG. 18B is an enlarged sectional view of a region N of FIG. 18A. In the following description, the elements of the first semiconductor chip previously described with reference to FIGS. 2, 3, and 4 may be identified by similar or identical reference numbers without repeating overlapping descriptions thereof for the sake of brevity.

Referring to FIGS. 2, 4, 18A, and 18B, a third lower insulating layer 120c may be provided to define a recess region RC. The recess region RC may be formed on entire areas including a center area CA and a peripheral areas PA1 and PA2 of the first semiconductor chip 20. On the other hand, the recess region RC may not be formed under a redistribution layer 130. When viewed in a plan view, the recess region RC may be spaced apart from the redistribution layer 130. For example, the recess region RC may not overlap with the redistribution layer 130, when viewed in a plan view.

Referring back to FIG. 18B, the recess region RC may have a bottom surface BT, which is positioned at a lower level than that of a top surface of the third lower layer 120c provided under the redistribution layer 130. An upper insulating layer 140a may be provided to directly cover a sidewall SW and the bottom surface BT of the recess region RC.

For example, s lower insulating structure 120 may include a first region RG1 and a second region RG2. When viewed in a plan view, the first region RG1 may overlap with the redistribution layer 130, and the second region RG2 may overlap with the recess region RC. Here, a top surface of the first region RG1 may be higher than a top surface of the second region RG2 (e.g., the bottom surface BT of the recess region RC).

Referring back to FIGS. 2, 9, 18A, and 18B, an upper portion of the lower insulating structure 120 may be etched while etching a conductive layer 134 and a barrier layer 132. For example, during the etching process, the conductive layer 134 and the barrier layer 132 exposed by a second photoresist pattern PR may be removed, and then, an upper portion of the third lower insulating layer 120c thereunder may be partially etched. Thus, during while forming the redistribution layer 130, the recess region RC may be formed in the third lower insulating layer 120c.

According to example embodiments of the inventive concepts, a semiconductor chip may include a redistribution layer whose pad portion includes two divided regions (e.g., a test region and a bonding region). In a testing process, a test probe may come into contact with the test region, and in a wire bonding process, a wire bonding may be performed on the bonding region. Accordingly, a wire connection failure, which may occur after a process of testing a semiconductor chip, may be inhibited or prevented.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor chip comprising:
    an integrated circuit on a substrate;
    a center pad on the substrate and electrically connected to the integrated circuit;
    a lower insulating structure on the center pad, the lower insulating structure having a contact hole exposing the center pad therethrough, the lower insulating structure including a plurality of lower insulating layers sequentially stacked on the substrate;
    a conductive pattern including a contact portion, a pad portion, and a conductive line portion, the contact portion filling the contact hole, the pad portion including a test region and a bonding region, the conductive line portion on the lower insulating structure and connecting the contact portion to the pad portion; and
    an upper insulating structure on the conductive pattern, the upper insulating structure having a first opening exposing the pad portion, the upper insulating structure including an upper insulating layer and a polymer layer, the upper insulating layer covering the lower insulating structure and the conductive pattern, the polymer layer on the upper insulating layer.

2. The semiconductor chip of claim 1, wherein the polymer layer provides a separation pattern on a region between the test region and the bonding region.

3. The semiconductor chip of claim 2, wherein
the first opening comprises a first sub-opening and a second sub-opening divided by the separation pattern, and
the first and second sub-openings expose the test and bonding regions, respectively.

4. The semiconductor chip of claim 2, wherein the pad portion further comprises a bridge region between the test region and the bonding region.

5. The semiconductor chip of claim 1, wherein
the pad portion has a first width in a first direction and a second width in a second direction crossing the first direction,
the first and second directions are parallel to a top surface of the substrate,
the bonding region is spaced apart from the rest region in the first direction, and
the first width ranges from 1.5 to 3 times the second width.

6. The semiconductor chip of claim 1, wherein
the contact portion has a first thickness in a direction perpendicular to a top surface of the substrate and a second thickness in another direction parallel to the top surface of the substrate, and
the first thickness is greater than the second thickness.

7. The semiconductor chip of claim 1, wherein the upper insulating structure further includes a second opening exposing the contact portion.

8. The semiconductor chip of claim 1, wherein the center pad is electrically connected to the integrated circuit through a plurality of metal layers and a plurality of vias.

9. The semiconductor chip of claim 1, wherein, when viewed in a plan view,
the center pad is on a center area of the semiconductor chip, and
the pad portion is on a peripheral area of the semiconductor chip.

10. The semiconductor chip of claim 1, wherein each of the lower insulating layers includes at least one of a silicon nitride layer, a silicon oxide layer, or a silicon oxynitride layer.

11. The semiconductor chip of claim 1, further comprising:
a barrier pattern between the lower insulating structure and the conductive pattern,
wherein, when viewed in a plan view, the barrier pattern overlaps with the conductive pattern.

12. A semiconductor package, comprising:
a package substrate; and
at least one semiconductor chip on the package substrate and electrically connected to the package substrate through a wire, the at least one semiconductor chip including,
a first surface facing the package substrate and a second surface opposite to the first surface,
a center pad on the second surface,
a lower insulating structure having a contact hole exposing the center pad,
a conductive pattern comprising a contact portion, a pad portion, and a conductive line portion, the contact portion filling the contact hole, the pad portion including a test region and a bonding region, the pad portion having a first width in a first direction and a second width in a second direction crossing the first direction, the first and second directions being parallel to the second surface, the bonding region spaced apart from the test region in the first direction and connected to the wire, the first width ranging from 1.5 to 3 times the second width, the conductive line portion on the lower insulating structure and connecting the contact portion to the pad portion, and
an upper insulating structure on the conductive pattern, the upper insulating structure having an opening defined therein, the opening exposing the pad portion.

13. The semiconductor package of claim 12, wherein the lower insulating structure comprises:
a first lower insulating layer vertically adjacent to the center pad;
a second lower insulating layer vertically adjacent to the upper insulating structure; and
a third lower insulating layer between the first and second lower insulating layers.

14. The semiconductor package of claim 12, wherein the upper insulating structure comprises:
an inorganic insulating layer on the lower insulating structure and the conductive pattern, the inorganic insulating layer including silicon; and
a polymer layer on the inorganic insulating layer.

15. The semiconductor package of claim 12, wherein the at least one semiconductor chip includes a plurality of semiconductor chips, which are sequentially stacked on the package substrate, and at least one of the plurality of semiconductor chips is electrically connected to the package substrate through the pad portion and the wire.

16. A semiconductor package comprising:
a package substrate;
a semiconductor chip including,
a chip substrate, a chip pad on the chip substrate, the chip pad electrically connected to an integrated circuit and exposed through a lower insulating structure,
a conductive pattern connected to the chip pad at around a first end portion thereof and extending on the lower insulating structure, and
an upper insulating structure on the conductive pattern and the lower insulating structure, the upper insulating structure including an opening divided by a separation pattern, the opening being at around a second end portion of the conductive pattern, the second end portion being opposite to the first end portion, portions of the conductive pattern exposed by the opening functioning as a pad portion, the pad portion including a bonding region and a test region defined by the separation pattern, the test region being a region onto which a test probe is to be applied; and
a wire connecting the bonding region of the conductive pattern of the semiconductor chip to the package substrate, wherein
the lower insulating structure is between the chip substrate and the conductive pattern,
the lower insulating structure has a recess region at an upper portion thereof, and
the recess region does not overlap with the conductive pattern when viewed in a plan view.

17. The semiconductor package of claim 16, wherein
the pad portion further includes a bridge region under the separation pattern, and
the bridge region is interposed between and connected to the bonding region and the test region in a first direction along the bonding region and the test region.

18. The semiconductor package of claim 17, wherein the bridge region is narrower than the bonding region and the test region in the first direction.

19. The semiconductor package of claim 18, wherein the separation pattern includes portions, which fill regions unoccupied by the bridge region between the bonding region and the test region.

20. The semiconductor package of claim 16, wherein
the upper insulating structure includes an upper insulating layer and a polymer layer,
the upper insulating layer covers the lower insulating structure and the conductive pattern, and
the polymer layer is on the upper insulating layer.

* * * * *